US011249120B2

(12) United States Patent
Chen et al.

(10) Patent No.: US 11,249,120 B2
(45) Date of Patent: Feb. 15, 2022

(54) METHOD AND DEVICE FOR DETECTING ELECTRICITY THEFT, AND COMPUTER READABLE MEDIUM

(71) Applicant: Tsinghua University, Beijing (CN)

(72) Inventors: Qixin Chen, Beijing (CN); Kedi Zheng, Beijing (CN); Yi Wang, Beijing (CN); Chongqing Kang, Beijing (CN); Qing Xia, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 195 days.

(21) Appl. No.: 16/844,798

(22) Filed: Apr. 9, 2020

(65) Prior Publication Data
US 2020/0233021 A1   Jul. 23, 2020

Related U.S. Application Data

(63) Continuation of application No. PCT/CN2018/094537, filed on Jul. 4, 2018.

(30) Foreign Application Priority Data

Mar. 29, 2018   (CN) .................. 201810270822.X

(51) Int. Cl.
*G01R 22/06* (2006.01)
*G06Q 50/06* (2012.01)
*G01R 22/10* (2006.01)

(52) U.S. Cl.
CPC .......... *G01R 22/066* (2013.01); *G01R 22/10* (2013.01); *G06Q 50/06* (2013.01)

(58) Field of Classification Search
CPC ........... G06K 9/00496; G06K 9/00523; G06K 9/0053; G06Q 50/06; G01R 22/00; G01R 22/06; G01R 22/061; G01R 22/066; G01R 22/10
See application file for complete search history.

(56) References Cited

U.S. PATENT DOCUMENTS

| | | | | |
|---|---|---|---|---|
| 9,595,006 | B2* | 3/2017 | Dhurandhar | G08B 21/18 |
| 2007/0247331 | A1* | 10/2007 | Angelis | G01D 4/006 340/870.02 |
| 2008/0109387 | A1* | 5/2008 | Deaver | G01R 19/16547 705/412 |
| 2010/0007336 | A1* | 1/2010 | de Buda | H04B 3/56 324/127 |
| 2016/0035049 | A1* | 2/2016 | Ramesh | H04W 4/38 705/412 |

OTHER PUBLICATIONS

WIPO, ISR of PCT/CN2018/094537, dated Dec. 28, 2018.

* cited by examiner

*Primary Examiner* — Huy Q Phan
*Assistant Examiner* — David B Frederiksen
(74) *Attorney, Agent, or Firm* — Hodgson Russ LLP

(57) ABSTRACT

The present disclosure provides a method and a device for detecting electricity theft, and a computer readable medium, smart meter data of each user and aggregated electricity consumption data are obtained during the detection period in the target area, a load profile set and non-technical loss data are obtained, and a correlation between each load profile in the load profile set and the non-technical loss data is obtained through a maximum information coefficient method and based on the smart meter data and the aggregated electricity consumption data, so as to obtain a correlation indicator for measuring the correlation.

18 Claims, 3 Drawing Sheets

METHOD AND DEVICE FOR DETECTING ELECTRICITY THEFT, AND COMPUTER READABLE MEDIUM

CROSS-REFERENCE TO RELATED APPLICATION

This application is a continuation of International Application No. PCT/CN 2018/094537, filed Jul. 4, 2018, which claims priority to Chinese Patent Application No. 201810270822.X, filed Mar. 29, 2018, the entire disclosures of which are incorporated herein by reference.

TECHNICAL FIELD

The present disclosure relates to the field of electricity theft technology, and more particularly to a method and a device for detecting electricity theft, and a computer readable medium.

BACKGROUND

In the related art, the electricity theft detection has low accuracy, and needs to be improved.

SUMMARY

Embodiments of the present disclosure provide a method for detecting electricity theft. The method includes: obtaining, by a smart meter, smart meter data of each user during a detection period in a target area; obtaining, by an observer meter, aggregated electricity consumption data during the detection period in the target area; obtaining, by a processor, a load profile set and non-technical loss data based on the smart meter data and the aggregated electricity consumption data; obtaining, by the processor, a correlation between each load profile in the load profile set and the non-technical loss data through a maximum information coefficient method and based on the smart meter data and the aggregated electricity consumption data, to obtain a correlation indicator for measuring the correlation; for each load profile in the load profile set, obtaining, by the processor, a neighborhood density of the load profile and a distance from the load profile to an area with a higher density through a fast search and find of density peaks method, to obtain a shape indicator for measuring an abnormality of the load profile; performing, by the processor, k-means cluster on correlation indicators to divide the correlation indicators into a first group and a second group, and performing, by the processor, k-means cluster on shape indicators to divide the shape indicators into a third group and a fourth group; determining, by the processor, a mean value of the correlation indicators in the second group as an electricity abnormality indicator, and determining, by the processor, a mean value of the shape indicators in the fourth group as a shape abnormality indicator; and obtaining, by the processor, an electricity consumption abnormality rank and a load profile shape abnormality rank based on the electricity abnormality indicator and the shape abnormality indicator, and obtaining a combined abnormality rank based on the electricity consumption abnormality rank and the load profile shape abnormality rank.

Embodiments of the present disclosure provide a non-transitory computer-readable storage medium having stored therein instructions that, when executed by a processor of a computer, causes the computer to perform the method for detecting electricity theft.

It is to be understood that both the foregoing general description and the following detailed description are exemplary and explanatory only and are not restrictive of the present disclosure, as claimed.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

In order to make objectives, technical solutions and advantages of the present disclosure clearer, in the following the present disclosure will be described in detail with reference to drawings. Apparently, the described embodiments are only some embodiments of the present disclosure and do not represent all the embodiments. Based on the embodiment described herein, all the other embodiments obtained by those skilled in the art without creative labor belong to the protection scope of the present disclosure.

Figure 1:
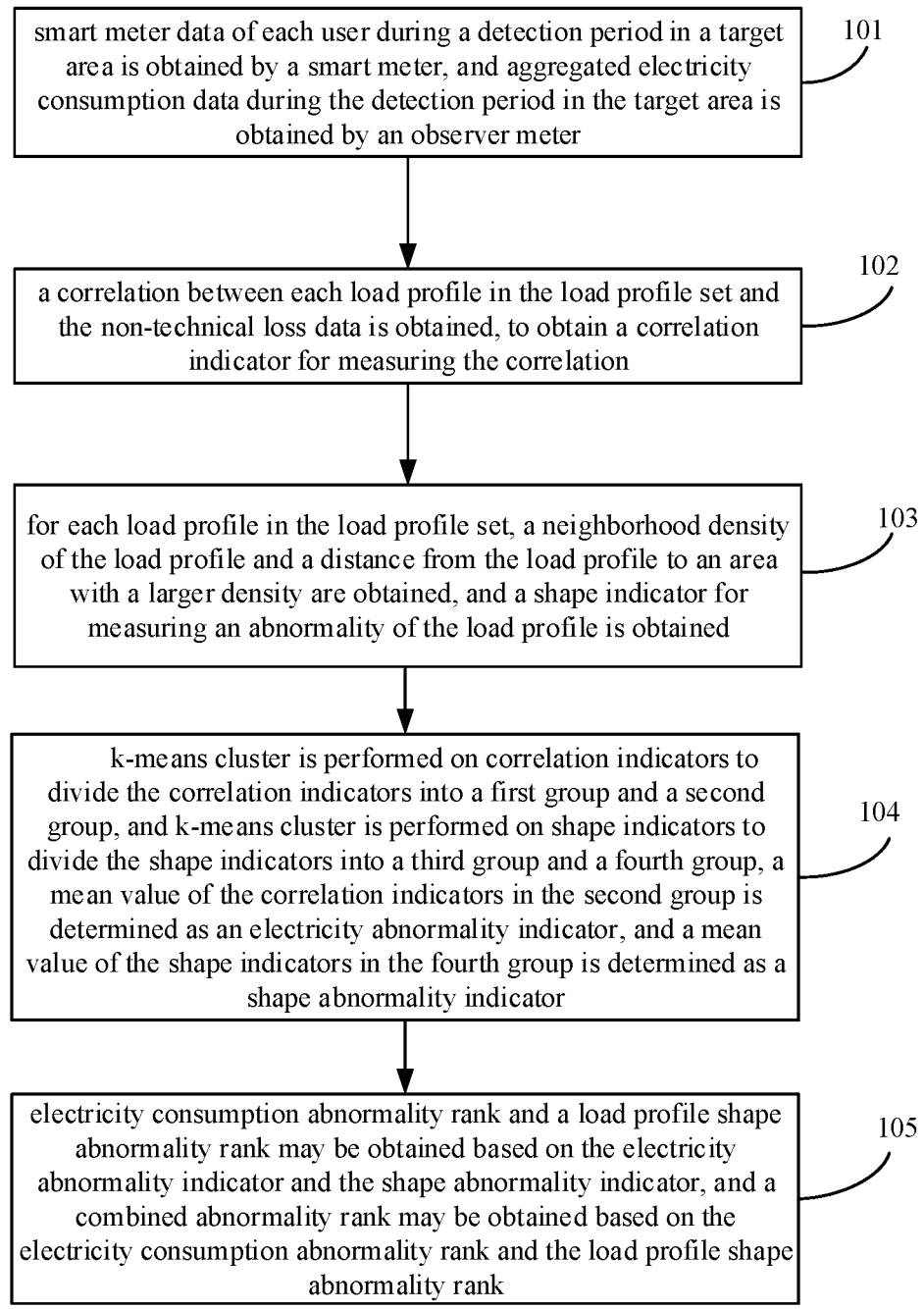
FIG. 1 is a flowchart of a method for detecting electricity theft according to some embodiments of the present disclosure.

FIG. 1 is a flowchart of a method for detecting electricity theft according to some embodiments of the present disclosure. As illustrated in FIG. 1, the method includes followings.

At block 101, electricity consumption data of each user during a detection period in a target area are obtained by his/her smart meter, and aggregated electricity consumption data of the target area during the detection period are obtained by an observer meter.

In some embodiments, the load profile may denote the electricity consumption reading sequence recorded by the smart meter of the user in a day, and the observer meter may be configured to record the aggregated electricity consumption in the area.

In some embodiments, a load profile set and non-technical loss data may be obtained based on the smart meter data and the aggregated electricity consumption data. The load profiles of all users during the detection period in the target area may be obtained, and the aggregated electricity consumption sequence recorded by the observer meter may be obtained, the non-technical loss data in the area within the time period to be detected may be obtained by subtracting the sum of electricity consumption of all the users at each moment from the aggregated electricity consumption sequence. In an example, the non-technical loss may be caused by factors such as electricity theft.

Figure 2:
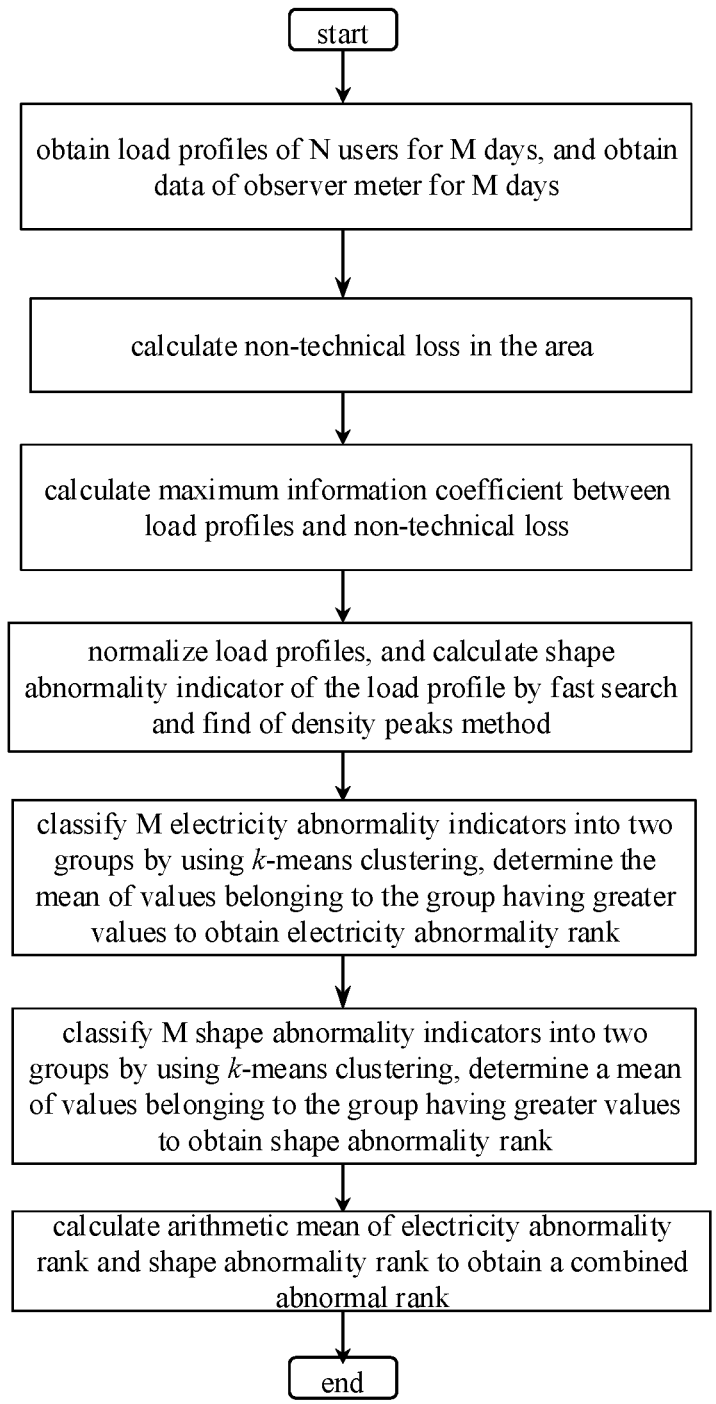
FIG. 2 is a flowchart of a method for detecting electricity theft according to some embodiments of the present disclosure.

FIG. 2 is a flowchart of a method for detecting electricity theft according to some embodiments of the present disclosure, as illustrated in FIG. 2, the non-technical loss data may be calculated based on the readings of the smart meter and the observer meter. In an example, the non-technical loss data may be calculated by:

$$e_t = E_t - \sum_{i=1}^{N} x_{it}$$

where $e_t$ is the non-technical loss data, $E_t$ is the ground truth aggregated electricity consumption data recorded by the observer meter, $x_{it}$ is an electricity consumption of a user i at time t recorded by the smart meter, t=1, 2, ..., M×T, M is the number of days to be detected, t is a recording cycle of the smart meter or the observer meter, and T is the daily sampling frequency of the smart meter or the observer meter.

At block 102, based on the smart meter data and the aggregated electricity consumption data, a correlation between each load profile in the load profile set and the non-technical loss data is obtained through a maximum information coefficient method, so as to obtain a correlation indicator for measuring the correlation.

In some embodiments, for each detection day, a maximum information coefficient of the area's loss data and load profile of each user may be obtained to obtain an electricity consumption indicator. The electricity consumption indicator is configured to measure the correlation between each load profile and the area's non-technical loss.

At block 103, for each load profile in the load profile set, a neighborhood density of the load profile and a distance from the load profile to an area with a higher density are obtained through a fast search and find of density peaks method, and a shape indicator for measuring the abnormality of a load profile is obtained.

In some embodiments, for each load profile, the load profile may be normalized by retaining the shape feature of the load profile, a Euclidean distance matrix between normalized load profiles may be obtained, and a cutoff distance may be generated by the fast search and find of density peaks method, and the density feature of each normalized load profile may be obtained, and the shape abnormality indicator of the load profile may be obtained according to the density feature.

For each user i, i=1, 2, ..., N, let the load profile $c_{ij} = [x_{i,(j-1)T+1} L \, x_{i,jT}]$, the maximum information coefficient $MIC(e_j, c_{ij})$ between $e_j$ and $c_{ij}$ may be obtained. The load profiles of all users may be normalized, and the normalized load profile set may be obtained by dividing the load profile by the maximum value of electricity consumption in all periods of the day. In an example, the normalized load profile set may be expressed by:

$$\bar{c}_{ij} = \frac{c_{ij}}{\max\{x_{i,(j-1)T+1}, L, x_{i,jT}\}} = \frac{c_{ij}}{\max c_{ij}}$$

where $\bar{c}_{ij}$ is the normalized load profile set, and $c_{ij}$ is the normalized load profile.

For M×N normalized load profiles $\bar{c}$, the Euclidean distance between any two load profiles may be calculated, and MN (MN−1) distance values $d_{1,2}, \ldots, d_{(MN-1),MN}$ may be obtained by arranging the distances ascendingly.

The cutoff distance $d_c$ is configured to calculate the local density corresponding to a certain data point. In the data set, the number of data points less than $d_c$ from the data point is the local density. The cutoff distance $d_c$ may be generated by the fast search and find of density peaks method, and the shape abnormality indicator may be calculated according to the neighborhood density and the distance from the normalized load profile p to the area having the higher density, which may be expressed by:

$$\zeta_p = \frac{\delta_p}{\rho_p + 1}$$

where $\zeta_p$ is the shape abnormality indicator for the normalized load profile p, $\rho_p$ is the neighborhood density of the normalized load profile p, and $\delta_p$ is the distance from the normalized load profile p to the area having the higher density. For a load profile p, its user index and date index may be denoted as i and j, respectively. The shape abnormality indicator $Z_{i,j}$ for user i on day j may be calculated as $Z_{i,j} = \zeta_p$. By corresponding $\zeta_p$ to the user i and the number of days j, the shape abnormality indicator $Z_{i,j}$ of the user i on day j can be obtained.

At block 104, k-means cluster is performed on correlation indicators to divide the correlation indicators into a first group and a second group, and k-means cluster is performed on shape indicators to divide the shape indicators into a third group and a fourth group, a mean value of the correlation indicators in the second group is determined as an electricity abnormality indicator, and a mean value of the shape indicators in the fourth group is determined as a shape abnormality indicator.

In some embodiments, the correlation indicators in the second group are greater than the correlation indicators in the first group, and the shape indicators in the fourth group are greater than the shape indicators in the third group.

In an example, k-means clustering with k=2 is used to partition the correlation indicators and shape indicators of each user into two groups, respectively. The correlation indicators of each user are partitioned into two groups according to their values, and the mean values of the two groups of correlation indicators are calculated. The maximum value of the two mean values is calculated as an electricity abnormality indicator. Similarly, the shape indicators of each user are partitioned into two groups according to their values, and the mean value of the two groups of shape indicators are calculated. The maximum value of the two mean values is calculated as a shape abnormality indicator.

At block 105, an electricity consumption abnormality rank and a load profile shape abnormality rank may be obtained based on the electricity abnormality indicator and the shape abnormality indicator, and a combined abnormality rank may be obtained based on the electricity consumption abnormality rank and the load profile shape abnormality rank.

In some embodiments, obtaining the electricity consumption abnormality rank and a load profile shape abnormality rank based on the electricity abnormality indicator and the shape abnormality indicator and obtaining the combined abnormality rank based on the electricity consumption abnormality rank and the load profile shape abnormality rank may include the followings acts.

For the user i with M $MIC(e_j, c_{ij})$ values, a k-means clustering method is applied with k=2, the M MIC $(e_j, c_{ij})$ values are classified into two groups. The arithmetic mean values of the two groups are calculated, and the maximum value $Q_i$ of the two mean values is determined as the electricity abnormality indicator. A first suspicion ranking $Rank_1$ of the N users can be obtained based on $Q_i$. The larger the $Q_i$ is, the higher the second suspicion ranking $Rank_1$ corresponding to the user i is.

In an example, for a user i and a detection period of 7 days, there are 7 load profiles and 7 MIC values as the correlation indicators. These values may be listed as: 0.1, 0.2, 0.3, 0.8, 0.25, 0.9, 0.1. By performing k-means cluster, these correlation indicators may be divided into two groups, including a first group: 0.1, 0.2, 0.3, 0.25, 0.1, and a second group: 0.8, 0.9. The arithmetic mean value of the first group may be calculated as 0.19, and the arithmetic mean value of the second group may be calculated as 0.85. Then, 0.85, i.e., the maximum of the two arithmetic mean values, may be regarded as the electricity abnormality indicator for the user i.

For the user i with $M_{i,j}$ values, a k-means clustering method is applied with k=2, the M $Z_{i,j}$ values are classified into two groups. The arithmetic mean values of the two groups are calculated, and the maximum value $S_i$ of the two mean values is determined as the shape abnormality indicator. And a second suspicion ranking $Rank_2$ of the N users can be obtained based on $S_i$. The larger the $S_i$ is, the higher the second suspicion ranking $Rank_2$ corresponding to the user i is.

In an example, for a user i and a detection period of 7 days, there are 7 load profiles and 7 MIC values as the shape indicators. These values may be listed as: 0.4, 0.5, 0.05, 0.1, 0.12, 0.6, 0.02. By performing k-means cluster, these shape indicators may be divided into two groups, including a third group: 0.05, 0.1, 0.12, 0.02, and a fourth group: 0.4, 0.5, 0.6. The arithmetic mean value of the third group may be calculated as 0.0725, and the arithmetic mean value of the fourth group may be calculated as 0.5. Then, 0.5, i.e., the maximum of the two arithmetic mean values, may be regarded as the shape abnormality indicator for the user i.

The arithmetic mean of the first suspicion ranking $Rank_1$ and the second suspicion ranking $Rank_2$ can be obtained, which may be expressed by:

$$Rank = \frac{1}{2}(Rank_1 + Rank_2)$$

Then, the abnormality ranking the users can obtained, and the detection of electricity theft can be achieved based on the abnormality ranking, such that the accuracy and applicability of detection can be improved.

With the method for detecting electricity theft according to embodiments of the present disclosure, the load profile set and the non-technical loss data are obtained, the correlation indicator and the shape indicator are obtained, the k-means clustering method is applied to divide the correlation indicators and the shape indicators into two groups, respectfully, and the electricity consumption abnormality rank and the load profile shape abnormality rank are obtained based on the electricity abnormality indicator and the shape abnormality indicator, and the combined abnormality rank is obtained based on the arithmetic mean of the electricity abnormality indicator and the shape abnormality indicator, such that electricity theft can be detected, accuracy of detection in various power stealing mode can be improved, thereby achieving unsupervised detection of power stealing behavior under big data, and increasing the scope of application.

Figure 3:
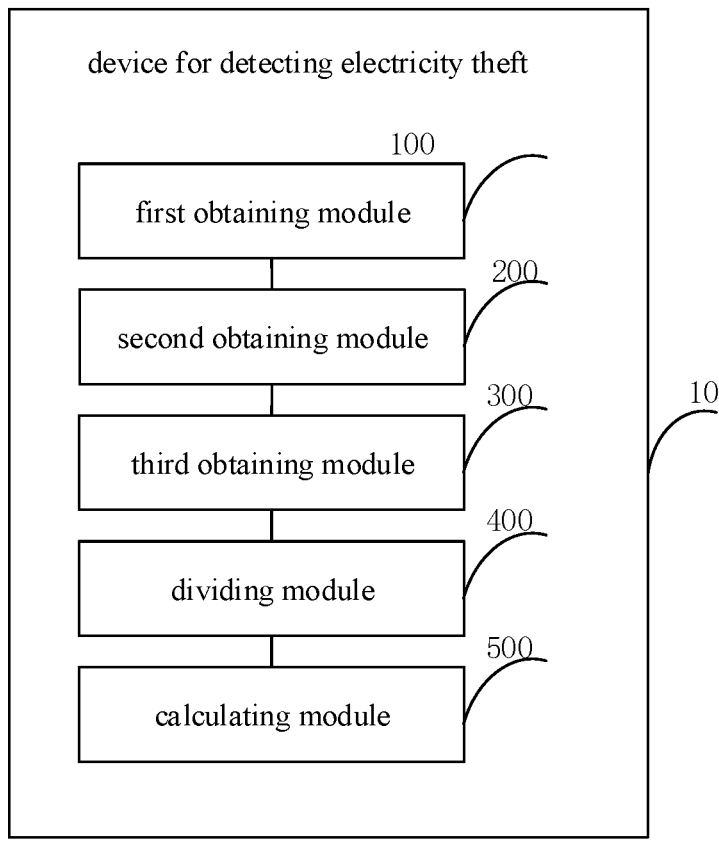
FIG. 3 is a block diagram of a device for detecting electricity theft according to some embodiments of the present disclosure.
Figure 4:
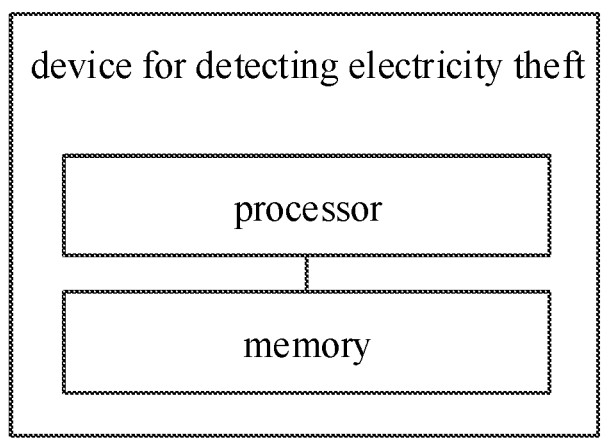
FIG. 4 is a block diagram of a device for detecting electricity theft according to some embodiments of the present disclosure.

The present disclosure further provides a device for detecting electricity theft. FIG. 3 is a block diagram of a device for detecting electricity theft according to some embodiments of the present disclosure, as shown in FIG. 3, the device may include a first obtaining module 100, a second obtaining module 200, a third obtaining module 300, a dividing module 400, and a calculating module 500.

The first obtaining module 100 is configured to obtain smart meter data of each user during a detection period in a target area through a smart meter, obtain aggregated electricity consumption data during the detection period in the target area through an observer meter, and obtain a load profile set and non-technical loss data based on the smart meter data and the aggregated electricity consumption data.

The second obtaining module 200 is configured to obtain a correlation between each load profile in the load profile set and the non-technical loss data through a maximum information coefficient method and based on the smart meter data and the aggregated electricity consumption data, to obtain a correlation indicator for measuring the correlation.

The third obtaining module 300 is configured to, for each load profile in the load profile set, obtain the neighborhood density of the load profile and a distance from the load profile to an area with a larger density through a fast search and find of density peaks method, to obtain a shape indicator for measuring the shape abnormality of the load profile.

The dividing module 400 is configured to perform k-means cluster on correlation indicators to divide the correlation indicators into a first group and a second group, and perform k-means cluster on shape indicators to divide the shape indicators into a third group and a fourth group; determine a mean value of the correlation indicators in the second group as an electricity abnormality indicator, and determine a mean value of the shape indicators in the fourth group as a shape abnormality indicator.

In some embodiments, the correlation indicators in the second group are greater than the correlation indicators in the first group, and the shape indicators in the fourth group are greater than the shape indicators in the third group.

The calculating module 500 is configured to obtain an electricity consumption abnormality rank and a load profile shape abnormality rank based on the electricity abnormality indicator and the shape abnormality indicator, and obtain a combined abnormality rank based on the electricity consumption abnormality rank and the load profile shape abnormality rank.

In some embodiments, the first obtaining module 100 is configured to: obtain load profiles of all users during the detection period in the target area; obtain the non-technical loss data by subtracting a sum of electricity consumption of all the users at each moment from the aggregated electricity consumption data; and obtain an area's loss data based on the non-technical loss at each moment on a daily basis.

In some embodiments, the second obtaining module 200 is configured to: for each detection day, obtain a maximum information coefficient of the area's loss data and load profile of each user to obtain an electricity consumption indicator. The electricity consumption indicator is configured to measure the correlation between each load profile and the area's non-technical loss.

In some embodiments, the third obtaining module 300 is configured to: for each load profile, normalize the load profile by retaining a shape feature of the load profile; obtain a Euclidean distance matrix between normalized load profiles, and generate a cutoff distance by the fast search and find of density peaks method; and obtain a density feature of each normalized load profile, and obtain the shape abnormality indicator of the load profile according to the density feature.

In some embodiments, the non-technical loss data is calculated by:

$$e_t = E_t - \sum_{i=1}^{N} x_{it}$$

where $e_t$ is the non-technical loss data, $E_t$ is the aggregated electricity consumption data recorded by the observer meter, $x_{it}$ is an electricity consumption of a user i at time t recorded by the smart meter, t=1, 2, . . . , M×T, M is the number of days to be detected. The area's loss data is expressed by:

$$e_j = [e_{(j-1) \cdot T+1} L \; e_{j \cdot T}],$$

where $e_j$ is the area's loss data, j is the index for days, j=1, 2, . . . , M.

In some embodiments, the normalized load profile set is expressed by:

$$\bar{c}_{ij} = \frac{c_{ij}}{\max\{x_{i,(j-1)T+1}, L, x_{i,jT}\}} = \frac{c_{ij}}{\max c_{ij}}$$

where $\bar{c}_{ij}$ is the normalized load profile set, and $c_{ij}$ is the normalized load profile. The shape abnormality indicator is expressed by:

$$\zeta_p = \frac{\delta_p}{\rho_p + 1}$$

where $\xi_p$ is the shape abnormality indicator for a normalized load profile p, $\rho_p$ is the neighborhood density of the normalized load profile p, and $\delta_p$ is the distance from the normalized load profile p to the area having the higher density.

It should be noted that, the foregoing explanation of the embodiments of the method for detecting electricity theft is also applicable to the device of the embodiment, and details are not repeated here.

With the device for detecting electricity theft according to embodiments of the present disclosure, the load profile set and the non-technical loss data are obtained, the correlation indicator and the shape indicator are obtained, the k-means clustering method is applied to divide the correlation indicators and the shape indicators into two groups, respectfully, and the electricity consumption abnormality rank and the load profile shape abnormality rank are obtained based on the electricity abnormality indicator and the shape abnormality indicator, and the combined abnormality rank is obtained based on the arithmetic mean of the electricity abnormality indicator and the shape abnormality indicator, such that electricity theft can be detected, accuracy of detection in various power stealing mode can be improved, thereby achieving unsupervised detection of power stealing behavior under big data, and increasing the scope of application.

The present disclosure further provides a non-transitory computer readable storage medium having computer instructions stored thereon. When the computer instructions are executed by a processor, the processor is caused to execute the method for detecting electricity theft according to embodiments of the present disclosure.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise,", "counterclockwise," "axial,", "radial,", and "circumferential" should be construed to refer to the orientation as then described or as shown in the drawings under discussion. These relative terms are for convenience of description and do not require that the present invention be constructed or operated in a particular orientation, and thus should not be construed as limiting the present disclosure.

In addition, terms such as "first" and "second" are used herein for purposes of description and are not intended to indicate or imply relative importance or significance or to imply the number of indicated technical features. Thus, the feature defined with "first" and "second" may comprise at least one feature. In the description of the present disclosure, "a plurality of" means at least two, for example, two or three, unless specified otherwise.

In the present disclosure, unless specified or limited otherwise, the terms "mounted", "connected", "coupled" and "fixed" should be understood in a broad sense. For example, it may be a fixed connection, a detachable connection, or an integral connection; it may be a mechanical connection or an electrical connection; it may also be a direct connection or an indirect connection via an intermediary, or it may be also be inner connection of two elements or an interaction between two elements. For those skilled in the art, the meaning of the above terms in the present disclosure can be understood according to specific situations.

In the present disclosure, unless otherwise expressly specified and limited, a structure in which a first feature is "on" or "below" a second feature may include that the first feature is in direct contact with the second feature, or in indirect contact with the second feature through an intermediate medium. Furthermore, a first feature "on," "above," or "on top of" a second feature may include that the first feature is right or obliquely "on," or "above," the second feature, or just means that the first feature is at a height higher than that of the second feature; while a first feature "below," "under," or "on bottom of" a second feature may include that the first feature is right or obliquely "below," or "under," the second feature, or just means that the first feature is at a height lower than that of the second feature.

Any process or method described in the flowing diagram or other means may be understood as a module, segment or portion including one or more executable instruction codes of the procedures configured to achieve a certain logic function or process, and the preferred embodiments of the present disclosure include other performances, in which the performance may be achieved in other orders instead of the order shown or discussed, such as in a almost simultaneous way or in an opposite order, which should be appreciated by those having ordinary skills in the art to which embodiments of the present disclosure belong.

The logic and/or procedures indicated in the flowing diagram or described in other means herein, such as a constant sequence table of the executable code for performing a logical function, may be implemented in any computer readable storage medium so as to be adopted by the code execution system, the device or the equipment (such a system based on the computer, a system including a processor or other systems fetching codes from the code execution system, the device and the equipment, and executing the codes) or to be combined with the code execution system, the device or the equipment to be used. With respect to the description of the present invention, "the computer readable storage medium" may include any device including, storing, communicating, propagating or transmitting program so as to be used by the code execution system, the device and the equipment or to be combined with the code execution system, the device or the equipment to be used. The computer readable medium includes specific examples (a non-exhaustive list): the connecting portion (electronic device) having one or more arrangements of wire, the portable computer disc cartridge (a magnetic device), the random access memory (RAM), the read only memory (ROM), the electrically programmable read only memory (EPROMM or the flash memory), the optical fiber device and the compact disk read only memory (CDROM). In addition, the computer readable storage medium even may be papers or other proper medium printed with program, as the papers or the proper medium may be optically scanned, then edited, interpreted or treated in other ways if necessary to obtain the program electronically which may be stored in the computer memory.

Each part of the present disclosure may be implemented by the hardware, software, firmware or the combination thereof. In the above embodiments of the present invention, the plurality of procedures or methods may be implemented by the software or hardware stored in the computer memory and executed by the proper code execution system. For example, if the plurality of procedures or methods is to be implemented by the hardware, like in another embodiment of the present invention, any one of the following known technologies or the combination thereof may be used, such as discrete logic circuits having logic gates for implementing various logic functions upon an application of one or more data signals, application specific integrated circuits having appropriate logic gates, programmable gate arrays (PGA), field programmable gate arrays (FPGA).

It can be understood by those having the ordinary skills in the related art that all or part of the steps in the method of the above embodiments can be implemented by instructing related hardware via programs, the program may be stored in a computer readable storage medium, and the program includes one step or combinations of the steps of the method when the program is executed.

In addition, each functional unit in the present disclosure may be integrated in one progressing module, or each functional unit exists as an independent unit, or two or more functional units may be integrated in one module. The integrated module can be embodied in hardware, or software. If the integrated module is embodied in software and sold or used as an independent product, it can be stored in the computer readable storage medium.

The non-transitory computer-readable storage medium may be, but is not limited to, read-only memories, magnetic disks, or optical disks.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for detecting electricity theft, comprising:
   obtaining, by a smart meter, smart meter data of each user during a detection period in a target area;
   obtaining, by an observer meter, aggregated electricity consumption data during the detection period in the target area;
   obtaining, by a processor, a load profile set and non-technical loss data based on the smart meter data and the aggregated electricity consumption data;
   for each load profile in the load profile set, obtaining, by the processor, a correlation between the load profile and the non-technical loss data through a maximum information coefficient method and based on the smart meter data and the aggregated electricity consumption data, to obtain a correlation indicator for measuring the correlation;
   for each load profile in the load profile set, obtaining, by the processor, a neighborhood density of the load profile and a distance from the load profile to an area with a higher density through a fast search and find of density peaks method, to obtain a shape indicator for measuring an abnormality of the load profile;
   performing, by the processor, k-means cluster on correlation indicators to divide the correlation indicators into a first group and a second group, and performing, by the processor, k-means cluster on shape indicators to divide the shape indicators into a third group and a fourth group, wherein the correlation indicators in the second group are greater than the correlation indicators in the first group, and the shape indicators in the fourth group are greater than the shape indicators in the third group;
   determining, by the processor, a mean value of the correlation indicators in the second group as an electricity abnormality indicator, and determining, by the processor, a mean value of the shape indicators in the fourth group as a shape abnormality indicator; and
   obtaining, by the processor, an electricity consumption abnormality rank and a load profile shape abnormality rank based on the electricity abnormality indicator and the shape abnormality indicator, and obtaining a combined abnormality rank based on the electricity consumption abnormality rank and the load profile shape abnormality rank.

2. The method according to claim 1, wherein obtaining the load profile set and non-technical loss data based on the smart meter data and the aggregated electricity consumption data comprises:
   obtaining load profiles of all users during the detection period in the target area;
   obtaining the non-technical loss data by subtracting a sum of electricity consumption of all the users at each moment from the aggregated electricity consumption data; and
   obtaining an area's loss data based on the non-technical loss at each moment on a daily basis.

3. The method according to claim 2, wherein obtaining the correlation between each load profile in the load profile set and the non-technical loss data based on the smart meter data and the aggregated electricity consumption data to obtain the correlation indicator for measuring the correlation comprises:

for each detection day, obtaining a maximum information coefficient of the area's loss data and the load profile of each user, to obtain an electricity consumption indicator, wherein the electricity consumption indicator is configured to measure a correlation between each load profile and area loss.

4. The method according to claim 1, wherein for each load profile in the load profile set, obtaining the neighborhood density of the load profile and the distance from the load profile to the area with the higher density through the fast search and find of density peaks method to obtain the shape indicator for measuring the abnormality of the load profile comprises:

for each load profile, normalizing the load profile by retaining a shape feature of the load profile;

obtaining a Euclidean distance matrix between normalized load profiles, and generating a cutoff distance by the fast search and find of density peaks method; and obtaining a density feature of each normalized load profile, and obtaining the shape abnormality indicator of the load profile according to the density feature.

5. The method according to claim 2, wherein the non-technical loss data is calculated by:

$$e_t = E_t - \sum_{i=1}^{N} x_{it}$$

where $e_t$ is the non-technical loss data, $E_t$ is the aggregated electricity consumption data recorded by the observer meter, $x_{it}$ is an electricity consumption of a user i at time t recorded by the smart meter, t=1, 2, ..., M×T, M is a number of days to be detected, wherein the area's loss data is expressed by:

$$e_j = [e_{(j-1)\cdot T+1} L\ e_{j\cdot T}],$$

where $e_j$ is the area's loss data, j is an index for days, j=1, 2, ..., M.

6. The method according to claim 4, wherein a normalized load profile set is expressed by:

$$\bar{c}_{ij} = \frac{c_{ij}}{\max\{x_{i,(j-1)T+1}, L, x_{i,jT}\}} = \frac{c_{ij}}{\max c_{ij}}$$

where $\bar{c}_{ij}$ is the normalized load profile set, and $c_{ij}$ is the normalized load profile, wherein the shape abnormality indicator is expressed by:

$$\zeta_p = \frac{\delta_p}{\rho_p + 1}$$

where $\xi_p$ is the shape abnormality indicator for a normalized load profile p, $\rho_p$ is the neighborhood density of the normalized load profile p, ands $\delta_p$ is the distance from the normalized load profile p to the area having the higher density.

7. A device for detecting electricity theft, comprising:
a processor; and
a memory, configured to store instructions executable by the processor,
wherein the processor is configured to perform the instructions stored in the memory, to:
obtain smart meter data of each user during a detection period in a target area through a smart meter;
obtain aggregated electricity consumption data during the detection period in the target area through an observer meter;
obtain a load profile set and non-technical loss data based on the smart meter data and the aggregated electricity consumption data;
for each load profile in the load profile set, obtain a correlation between the load profile and the non-technical loss data through a maximum information coefficient method and based on the smart meter data and the aggregated electricity consumption data, to obtain a correlation indicator for measuring the correlation;
for each load profile in the load profile set, obtain a neighborhood density of the load profile and a distance from the load profile to an area with a higher density through a fast search and find of density peaks method, to obtain a shape indicator for measuring an abnormality of the load profile;
perform k-means cluster on correlation indicators to divide the correlation indicators into a first group and a second group, and perform k-means cluster on shape indicators to divide the shape indicators into a third group and a fourth group, wherein the correlation indicators in the second group are greater than the correlation indicators in the first group, and the shape indicators in the fourth group are greater than the shape indicators in the third group;
determine a mean value of the correlation indicators in the second group as an electricity abnormality indicator, and determine a mean value of the shape indicators in the fourth group as a shape abnormality indicator; and
obtain an electricity consumption abnormality rank and a load profile shape abnormality rank based on the electricity abnormality indicator and the shape abnormality indicator, and obtain a combined abnormality rank based on the electricity consumption abnormality rank and the load profile shape abnormality rank.

8. The device according to claim 7, wherein the processor is configured to perform the instructions stored in the memory, to:
obtain load profiles of all users during the detection period in the target area;
obtain the non-technical loss data by subtracting a sum of electricity consumption of all the users at each moment from the aggregated electricity consumption data; and
obtain an area's loss data based on the non-technical loss at each moment on a daily basis.

9. The device according to claim 8, wherein the processor is configured to perform the instructions stored in the memory, to:
for each detection day, obtain a maximum information coefficient of the area's loss data and the load profile of each user to obtain an electricity consumption indicator, wherein the electricity consumption indicator is configured to measure a correlation between each load profile and area loss.

10. The device according to claim 7, wherein the processor is configured to perform the instructions stored in the memory, to:
  for each load profile, normalize the load profile by retaining a shape feature of the load profile;
  obtain a Euclidean distance matrix between normalized load profiles, and generate a cutoff distance by the fast search and find of density peaks method; and
  obtain a density feature of each normalized load profile, and obtain the shape abnormality indicator of the load profile according to the density feature.

11. The device according to claim 8, wherein the non-technical loss data is calculated by:

$$e_t = E_t - \sum_{i=1}^{N} x_{it}$$

where $e_t$ is the non-technical loss data, $E_t$ is the aggregated electricity consumption data recorded by the observer meter, $x_{it}$ is an electricity consumption of a user i at time t recorded by the smart meter, t=1, 2, ..., M×T, M is a number of days to be detected,
where the area's loss data is expressed by:

$$e_j = [e_{(j-1) \cdot T+1} L \ e_{j \cdot T}],$$

where $e_j$ is the area's loss data, j is an index for days, j=1, 2, ..., M.

12. The device according to claim 10, wherein a normalized load profile set is expressed by:

$$\bar{c}_{ij} = \frac{c_{ij}}{\max\{x_{i,(j-1)T+1}, L, x_{i,jT}\}} = \frac{c_{ij}}{\max c_{ij}}$$

where $\bar{c}_{ij}$ is the normalized load profile set, and $c_{ij}$ is the normalized load profile,
wherein the shape abnormality indicator is expressed by:

$$\zeta_p = \frac{\delta_p}{\rho_p + 1}$$

where $\zeta_p$ is the shape abnormality indicator for a normalized load profile p, $\rho_p$ is the neighborhood density of the normalized load profile p, and $\delta_p$ is the distance from the normalized load profile p to the area having the higher density.

13. A non-transitory computer-readable storage medium having stored therein instructions that, when executed by a processor of a computer, causes the computer to perform a method for detecting electricity theft, the method comprising:
  obtaining smart meter data of each user during a detection period in a target area through a smart meter;
  obtaining aggregated electricity consumption data during the detection period in the target area through an observer meter;
  obtaining a load profile set and non-technical loss data based on the smart meter data and the aggregated electricity consumption data;
  for each load profile in the load profile set, obtaining a correlation between the load profile and the non-technical loss data through a maximum information coefficient method and based on the smart meter data and the aggregated electricity consumption data, to obtain a correlation indicator for measuring the correlation;
  for each load profile in the load profile set, obtaining a neighborhood density of the load profile and a distance from the load profile to an area with a higher density through a fast search and find of density peaks method, to obtain a shape indicator for measuring an abnormality of the load profile;
  performing k-means cluster on correlation indicators to divide the correlation indicators into a first group and a second group, and performing k-means cluster on shape indicators to divide the shape indicators into a third group and a fourth group, wherein the correlation indicators in the second group are greater than the correlation indicators in the first group, and the shape indicators in the fourth group are greater than the shape indicators in the third group;
  determining a mean value of the correlation indicators in the second group as an electricity abnormality indicator, and determining, by the processor, a mean value of the shape indicators in the fourth group as a shape abnormality indicator; and
  obtaining an electricity consumption abnormality rank and a load profile shape abnormality rank based on the electricity abnormality indicator and the shape abnormality indicator, and obtaining a combined abnormality rank based on the electricity consumption abnormality rank and the load profile shape abnormality rank.

14. The non-transitory computer-readable storage medium according to claim 13, wherein obtaining the load profile set and non-technical loss data based on the smart meter data and the aggregated electricity consumption data comprises:
  obtaining load profiles of all users during the detection period in the target area;
  obtaining the non-technical loss data by subtracting a sum of electricity consumption of all the users at each moment from the aggregated electricity consumption data; and
  obtaining an area's loss data based on the non-technical loss at each moment on a daily basis.

15. The non-transitory computer-readable storage medium according to claim 14, wherein obtaining the correlation between each load profile in the load profile set and the non-technical loss data based on the smart meter data and the aggregated electricity consumption data to obtain the correlation indicator for measuring the correlation comprises:
  for each detection day, obtaining a maximum information coefficient of the area's loss data and the load profile of each user, to obtain an electricity consumption indicator, wherein the electricity consumption indicator is configured to measure a correlation between each load profile and area loss.

16. The non-transitory computer-readable storage medium according to claim 13, wherein for each load profile in the load profile set, obtaining the neighborhood density of the load profile and the distance from the load profile to the area with the higher density through the fast search and find of density peaks method to obtain the shape indicator for measuring the abnormality of the load profile comprises:
  for each load profile, normalizing the load profile by retaining a shape feature of the load profile;
  obtaining a Euclidean distance matrix between normalized load profiles, and generating a cutoff distance by the fast search and find of density peaks method; and obtaining a density feature of each normalized load profile, and obtaining the shape abnormality indicator of the load profile according to the density feature.

17. The non-transitory computer-readable storage medium according to claim 14, wherein the non-technical loss data is calculated by:

$$e_t = E_t - \sum_{i=1}^{N} x_{it}$$

where $e_t$ is the non-technical loss data, $E_t$ is the aggregated electricity consumption data recorded by the observer meter, $x_{it}$ is an electricity consumption of a user i at time t recorded by the smart meter, t=1, 2, . . . , M×T, M is a number of days to be detected, wherein the area's loss data is expressed by:

$$e_j = [e_{(j-1)\cdot T+1} L \; e_{j\cdot T}],$$

where $e_j$ is the area's loss data, j is an index for days, j=1, 2, . . . , M.

18. The non-transitory computer-readable storage medium according to claim 16, wherein a normalized load profile set is expressed by:

$$\bar{c}_{ij} = \frac{c_{ij}}{\max\{x_{i,(j-1)T+1}, L, x_{i,jT}\}} = \frac{c_{ij}}{\max c_{ij}}$$

where $\bar{c}_{ij}$ is the load profile set normalized, and $c_{ij}$ is the load profile normalized, wherein the shape abnormality indicator is expressed by:

$$\zeta_p = \frac{\delta_p}{\rho_p + 1}$$

where $\zeta_p$ is the shape abnormality indicator for a normalized load profile p, $\rho_p$ is the neighborhood density of the normalized load profile p, and $\delta_p$ is the distance from the normalized load profile p to the area having the higher density.

* * * * *